GALVANOMAGNETIC SEMICONDUCTOR DEVICES

Filed Dec. 16, 1964 6 Sheets-Sheet 2

GALVANOMAGNETIC SEMICONDUCTOR DEVICES

Filed Dec. 16, 1964 6 Sheets-Sheet 6

3,267,405

GALVANOMAGNETIC SEMICONDUCTOR DEVICES

Herbert Weiss and Manfred Wilhelm, Nurnberg, Germany, assignors to Siemens-Schuckertwerke Aktiengesellschaft, Berlin-Siemensstadt, Germany, and Erlangen, Germany, a corporation of Germany Filed Dec. 16, 1964, Ser. No. 418,648
Claims priority, application Germany, July 31, 1962, S 80,682; Apr. 18, 1963, S 84,738; Apr. 23, 1963, S 84,816
18 Claims. (Cl. 338—32)

This application is a continuation-in-part application of our copending application Serial No. 273,776, filed April 17, 1963, and issued as U.S. Patent No. 3,226,225, December 28, 1965, and a continuation-in-part application of our copending application Serial No. 361,316, filed April 20, 1964 and now abandoned.

Our invention relates to electronic semiconductor devices of various types, preferentially to those utilizing galvanomagnetic effects of semiconductors such as magnetically variable resistors and potentiometers, Hall-voltage generators and related modulators, or photoelectric devices. In one of its aspects, our invention is an improvement over devices of the type described in U.S. Patent 2,894,234 of H. Weiss and H. Welker.

According to our invention, we have discovered that electronic devices for the above-mentioned and various other purposes can be greatly improved and made amenable to improved or novel uses by providing such devices with a semiconductor member whose crystalline body is not crystallographically homogeneous but contains, integrally embedded in the semiconductor substance proper, a multitude of electrically or magnetically different inclusions of individually small size as compared with those of the member and mutually spaced and generally aligned to form a spacial matrix within the crystal. Preferably the discrete inclusions are nondoping relative to the embedding semiconductor substance. More specifically, the embedding substance, in the metallurgical sense, consists of one phase, such as the eutectic, of the material, an the inclusions consist of a segregated second phase of the material.

According to another feature of our invention the geometric shape of the discrete and dispersed inclusions is anisotropic. This term is understood to mean that the inclusions have a preferred extension in at least one direction. The preferred inclusions described hereinafter are generally in the shape of needles or flakes as contrasted to predominantly globular shapes.

Before dealing with further features of our invention, some of the objects and advantages thereof will be explained presently.

It is known from the above-mentioned patent that semiconductors of high carrier mobility afford obtaining a large change in electric resistance in response to changes of a magnetic field to which the semiconductor is subjected. This galvanomagnetic effect is particularly evident if the geometric shape of the semiconductor is not that of an elongated rod with respective electrodes at the two ends, but if the semiconductor is shaped as a rectangular plate or circular disc. For example, when a rectangular plate of indium antimonide is subjected to a magnetic field of 10,000 Gauss, the electric resistance is increased about ten times if the ratio of electrode width to mutual electrode spacing is 3 to 1. To permit producing such plates with a highest feasible ohmic resistance, the semiconductor body must be provided with electrically good conducting intermediate layers corresponding to FIGS. 6 and 7 of Patent 2,894,234. This can be done by attaching a matrix of silver by an alloying or diffusion process. Such a process is rather difficult to perform and involves skillful use of special equipment.

Since according to our invention the semiconductor crystal itself is provided with an internally distributed matrix of electrically or magnetically good conducting inclusions, it is unnecessary to subsequently attach a silver matrix. The invention thus satisfies the object and achieves the advantage of eliminating the above-mentioned difficulties of the method heretofore employed.

In a semiconductor member according to the invention, the dispersed inclusions of good conducting material can readily be given a rather dense arrangement with virtually complete freedom as to the shape of the semiconductor member which, for example, can be made in the form of very thin wafers. That is, no limitation is imposed upon the shape and dimensions by the necessity heretofore encountered of subsequently attaching a predefined silver matrix to the semiconductor body.

In this respect, therefore, the invention also satisfies the object and achieves the advantage of more readily affording the production of high-ohmic semiconductor devices. Furthermore, in semiconductor members according to the invention the mutual spacing of the embedded inclusions usually amounts to but a few microns, and such a slight spacing can hardly ever be achieved by subsequently precipitating silver upon the semiconductor.

Another object of our invention is to improve the operational reliability of the semiconductor members, this being achieved by virtue of the fact that loosening of the matrix, as may occasionally occur with the known devices mentioned above, is impossible in a device according to the invention.

Further objects and advantages of our invention will be apparent from the following.

The inclusions, such as those consisting of material having better conductance than the embedding semiconductor substance, need not necessarily be arranged in regular distribution but may also consist of inclusions or dispersions, such as scale-shaped segregations, that are promiscuously distributed within the semiconductor. It is generally of advantage, however, that the ratio of mutual spacing to the scale diameter is not too large, although the inclusions should remain spaced from one another, and the axes normal to the respective scale areas should be approximately parallel to each other.

A good result is also obtained if the inclusions are needle-shaped, particularly if the longitudinal axes are substantially perpendicular to the flow of the electric current and perpendicular to the magnetic flux effective during operation of the semiconductor device.

As mentioned above, the inclusions, as a rule, consist of a segregated second phase which does not have doping action upon the embedding phase of the semiconductor substance proper. Any necessary doping, therefore, should be provided by the conventional addition of donors or acceptors in the usual manner. Doping by the segregated second phase would reduce the electron mobility in the semiconductor and thereby also the change of resistance in the magnetic field, and would also reduce the specific resistance of the semiconductor member.

It will be understood from the foregoing that the embedding semiconductor phase and the segregated second phase do not form a mix crystal (solid solution), in addition to the preferential condition for magnetoresistance devices that the semiconductor be not doped by the inclusions and that the latter preferably have an anisotropic structure.

A further advantage of the invention is the fact that, by virtue of the high-ohmic resistance and the simultaneous high carrier mobility, the semiconductor member is well suitable as a component in devices utilizing the Hall effect, for example in direct-voltage modulators and contactless potentiometers based upon the galvanomagnetic effect.

Semiconductor members and devices according to the invention are further suitable for measuring, regulating or controlling magnetic fields or for performing measuring, regulating or controlling operations in response to positional changes effected by displacement of the semiconductor member relative to a magnetic field.

In addition, a semiconductor member according to the invention is generally applicable wherever anisotropic electrical properties are desired, for example for photoelectric purposes.

Suitable as embedding semiconductor substance in devices according to the invention are semiconductor compounds, preferably of the $A^{III}B^{V}$ type, such as indium antimonide, indium arsenide and gallium antimonide, for example. Also applicable as embedding phase is a semiconducting element from the fourth group of the periodic system, for example germanium.

Generally suitable as inclusions for the above-mentioned semiconductor $A^{III}B^{V}$ compounds are corresponding compounds of iron, nickel, cobalt or chromium. Thus, nickel antimonide, cobalt antimonide, iron antimonide or chromium antimonide (NiSb, $CoSb_3$, $FeSb_2$, $CrSb_2$) can be employed generally as inclusions in an indium-antimonide (InSb) crystal. Also applicable as inclusions are ferromagnetic substances, for example manganese antimonide (MnSb). However, the inclusions may also consist of metals, for example of antimony, if the embedding semiconductor crystal consists of InSb or GaSb. Inclusions of Fe, Ni, Co, Mn-germanides are applicable in an embedding crystal of germanium.

The inclusions are either uniformly distributed over the entire cross section of the semiconductor body or only in given regions of the semiconductor body.

Semiconductor members according to the invention can be produced, for example, by melting the embedding semiconductor substance together with the inclusion material, such as an electrically good conducting material, in a suitable melting vessel such as a quartz boat. The melt is thereafter subjected to cooling and freezing. As mentioned, it is preferred and most advantageous to have the inclusions oriented in the crystal. For this purpose the freezing process must be performed accordingly, for instance by the so-called normal freezing method which permits the ingot to commence freezing at one end and to progressively solidify toward the other end, thus causing the occurrence of segregations in the form of the desired oriented inclusions. A similar orientation is obtainable by subjecting the ingot to zone melting. Another method of enforcing a desired orientation of the anisotropic inclusions is to perform the freezing under the effect of an external magnetic field.

As a rule, such a segregation of an insoluble phase in an embedding or base phase and an orientation of the segregations for the purposes of our invention can be achieved only if the ingot is produced from a melt of substantially eutectic composition. For obtaining anisotropic and oriented inclusions therefore, the selection of the base phase and the second phase from the above-exemplified materials should be such that the two substances form a eutectic with each other, and the composition of the melt should substantially correspond to the eutectic. Then the melt is homogeneous, and the inclusions come about only during freezing by segregation of the minor phase from the embedding semiconductor phase, these phases being mutually insoluble in the solid state. For this reason, cobalt antimonide ($CoSb_3$) is less suitable in conjunction with InSb crystals because it does not form a eutectic with InSb so that no needles or other anisotropic segregations occur. However, oriented anisotropic inclusions are obtainable, for example, with the following eutectic melts: InSb-Sb, GaSb-Sb, Ni-Sb, InSb-NiSb, InSb-MnSb, InSb-$CrSb_2$, InSb-$FeSb_2$, Ge-Ni, Ge-Mn, Ge-Fe, Ge-Co.

The invention will be further described with reference to the accompanying drawings illustrating various embodiments of the invention by way of example.

Figure 6A:
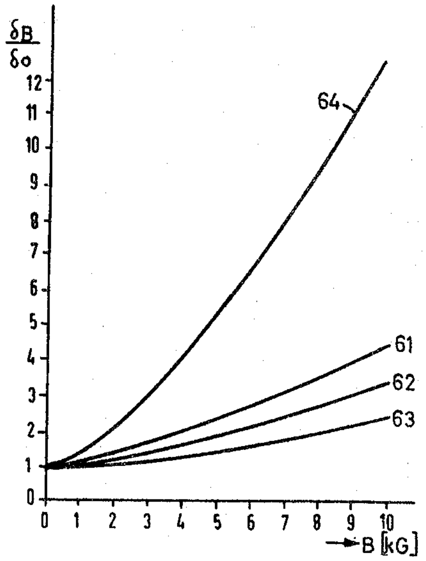
Figure 6B:
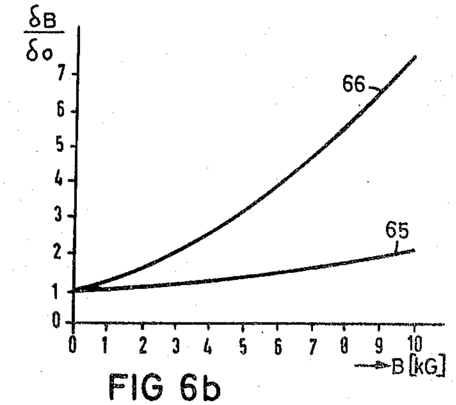

FIGS. 6*a* and 6*b* are explanatory graphs relating to the change in resistance in dependence upon the magnetic field for different semiconductor members according to the invention.

Figure 7:
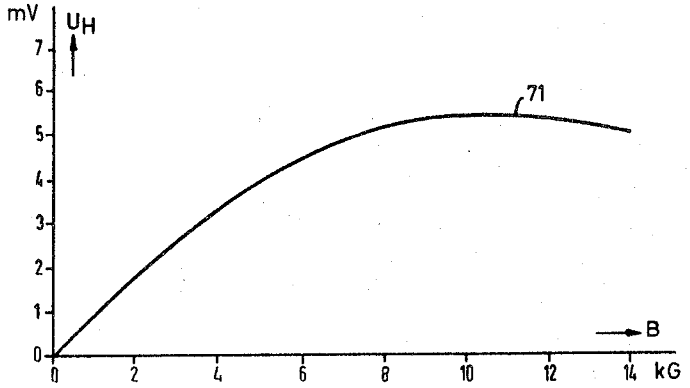

FIG. 7 is a graph exemplifying the dependence of the Hall voltage upon the magnetic induction.

Figure 8:
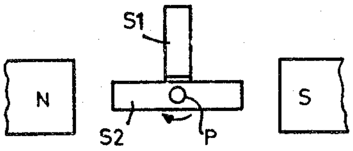
Figure 9:
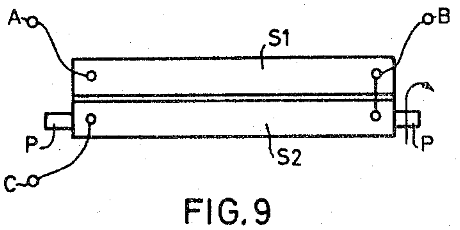
Figure 10:
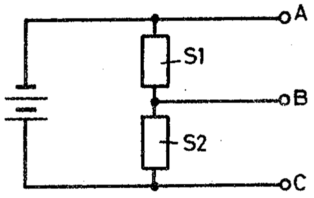
Figure 11:
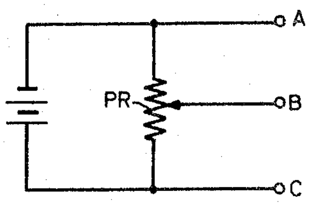

FIG. 8 shows schematically a stepless potentiometer device according to the invention, FIG. 9 is a lateral view of the appertaining semiconductor members, FIG. 10 shows the corresponding circuit diagram, and FIG. 11 is an equivalent diagram for explanatory purposes.

Figures 12, 13, 14:
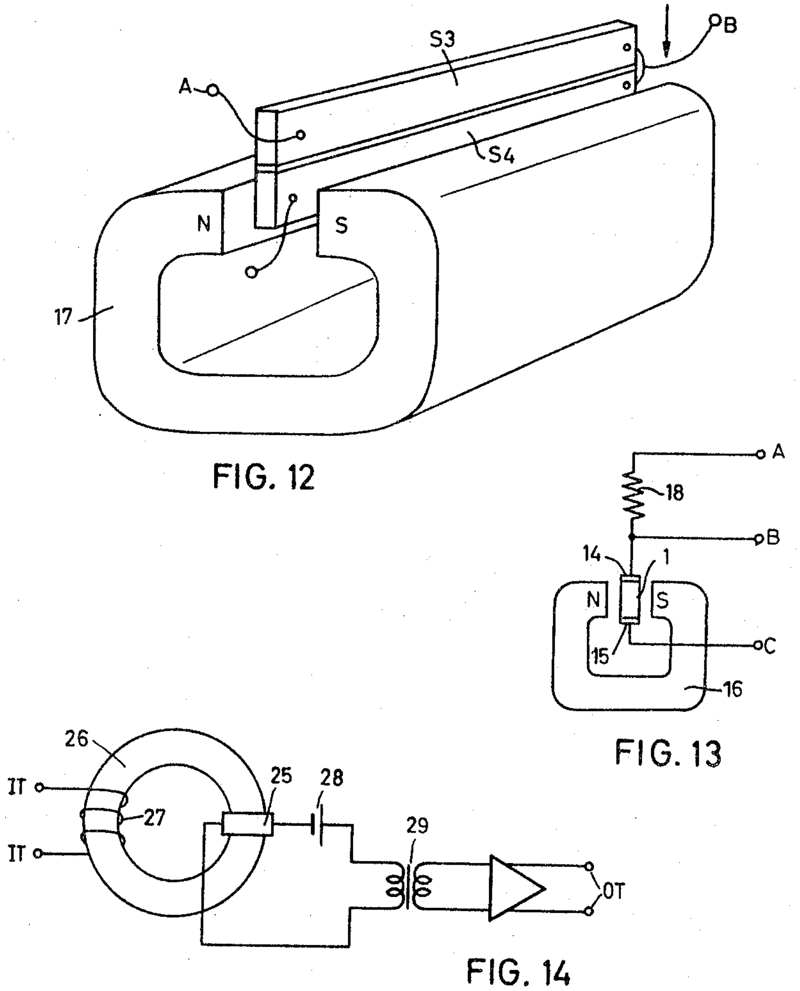

FIG. 12 is a schematic and perspective view of another potentiometric device.

FIG. 13 is the circuit diagram of still another potentiometric device. FIG. 14 is the circuit diagram of a direct-voltage modulator.

Figure 15:
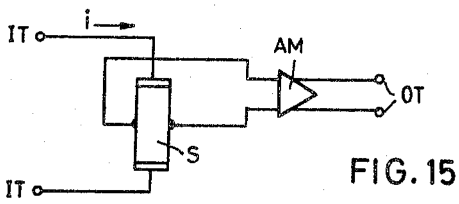
Figure 16:
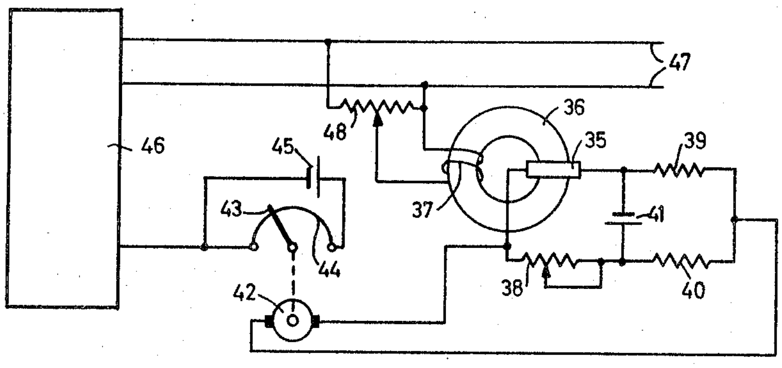
Figure 17:
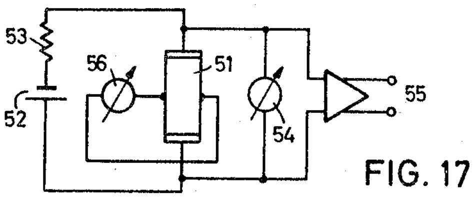

FIGS. 15, 16 and 17 are schematic circuit diagrams of regulating devices.

Figure 18:
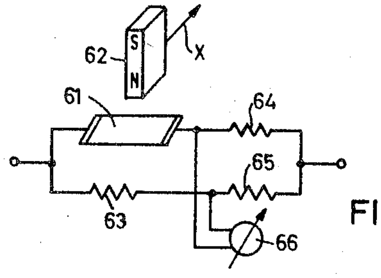
Figure 19:
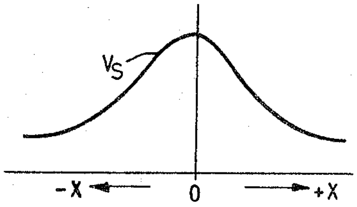

FIG. 18 is a circuit diagram and FIG. 19 an explanatory graph relating to a position-responsive signal transmitter.

Figure 20:
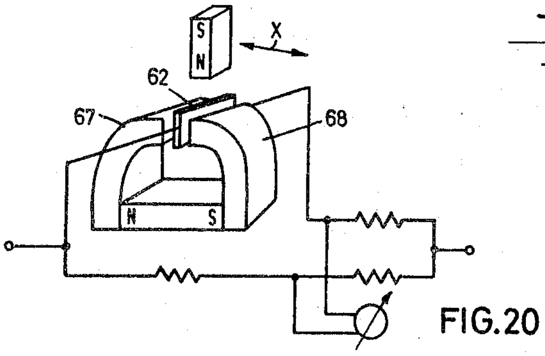
Figure 21:
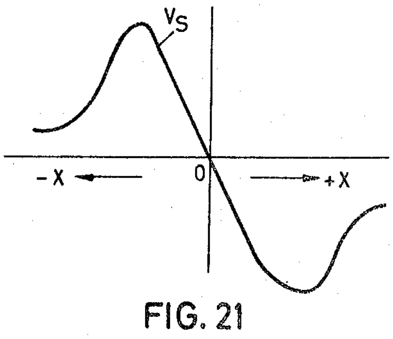

FIGS. 20 and 21 are a circuit diagram and an explanatory graph of another signal transmitter.

Figure 22:
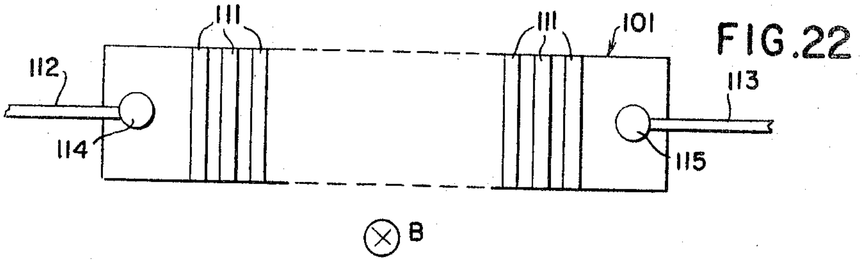

FIG. 22 shows schematically, for explanation, a known probe for the sensing or measuring of magnetic fields.

Figure 23:
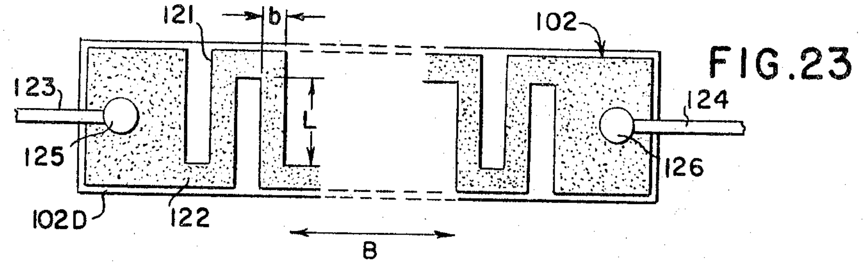

FIG. 23 shows a corresponding embodiment of a semiconductor device according to the invention.

Figure 24:
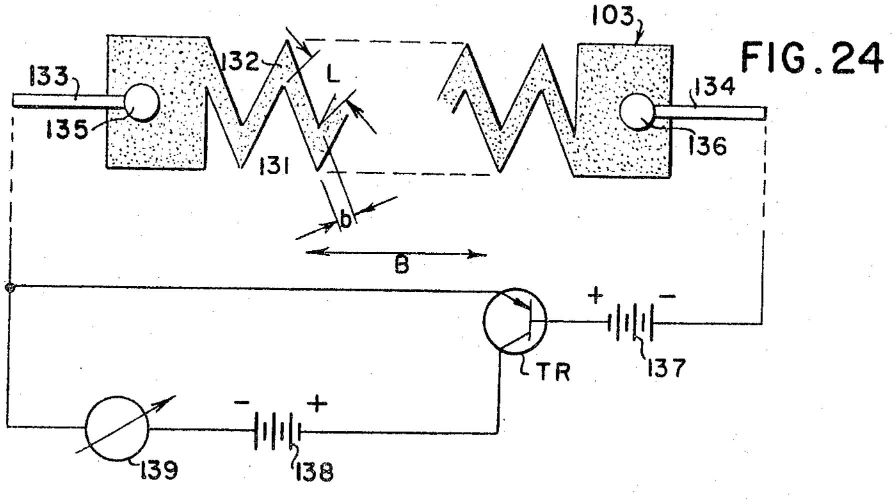

FIG. 24 shows another semiconductor device according to the invention in conjunction with an electric measuring circuit.

Figures 1, 2, 3, 4, 5:
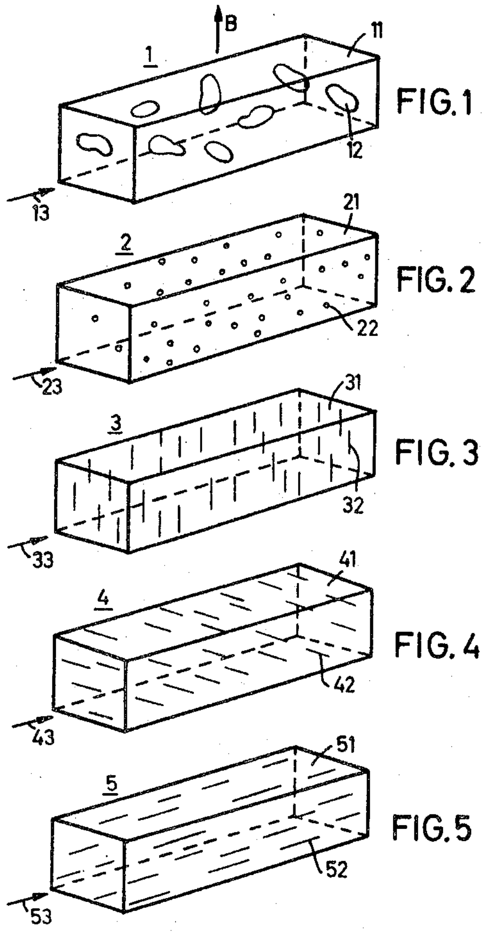
FIG. 1 shows in schematic perspective a semiconductor member according to the invention with flake-shaped inclusions.
FIG. 2 shows similarly a semiconductor member with globular inclusions.
FIGS. 3, 4 and 5 show three semiconductor members with needle-shaped inclusions of respectively different orientations.
Figure 25:
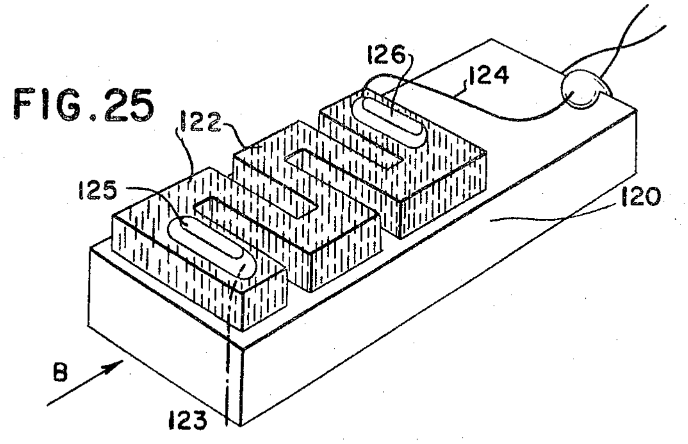

FIG. 25 is a schematic and perspective view of a device substantially corresponding to that of FIG. 2.

FIGS. 26 to 30 illustrate five resistance devices with loop-shaped semiconductor members.

Figure 31:
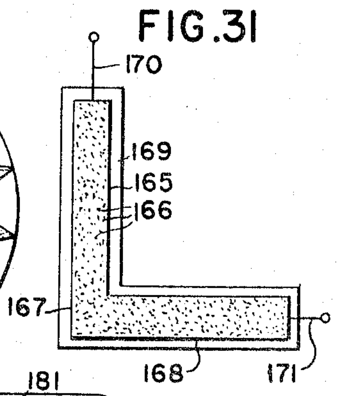

FIG. 31 shows a device of angular shape; and

Figure 32:
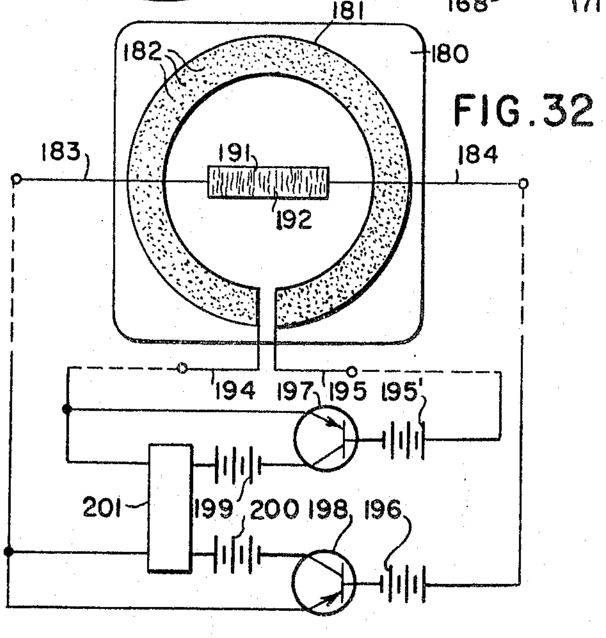

FIG. 32 shows a planar device suitable for measuring three-dimensional magnetic fields.

The semiconductor member shown in FIG. 1 consists of a crystalline semiconductor body 1, for example of indium antimonide, and area-type inclusions or flakes 12 of good electrical conductance in comparison with the semiconductor material. The inclusions consist, for example, of nickel antimonide (NiSb). The semiconductor substance and inclusion material in the embodiments according to FIGS. 2 to 5 may consist of the same respective substances just mentioned, or of any of the other combinations mentioned elsewhere in this specification.

It should be understood that in a complete device according to the invention the elongated semiconductor member according to FIG. 1 is provided with terminal electrodes. In the illustrated embodiment these electrodes are understood to be attached to the axial end faces of the crystal such as those shown at 14 and 15 in FIG. 13, for example. During operation, the electric current, represented in FIG. 1 by the arrow 13, flows through the semiconductor member in the direction of its longitudinal axis. The semiconductor member, for utilization of the magnetically responsive change in resistance, is simultaneously subjected to a magnetic field such as the one produced in the field gap between the poles N and S of the magnet 15 shown in FIG. 13. The direction of the magnetic field is indicated in FIG. 1 by an arrow B. The inclusions 12 according to FIG. 1 are irregularly distributed in the semiconductor substance of the member.

Relative to the semiconductor members shown in FIGS. 2 to 5, the following description is based on the assumption that they are connected and used in the same manner as described by way of example with reference to FIG. 1.

The semiconductor member according to FIG. 2 contains in its crystalline semiconductor body 21 a multitude of point-shaped or small globular inclusions 22 of irregular distribution. The electric current, indicated by an arrow 23, flows through the body in the direction of its longitudinal axis.

The semiconductor member 3 shown in FIG. 3 contains in the interior of its crystalline body 31 a multitude of needle-shaped inclusions 32. The longitudinal axes of the needles are oriented in parallel relation to each other, namely so that the electric current, indicated by an arrow 32, flows in a direction perpendicular to the longitudinal axes of the needles, and the external magnetic field B is directed parallel to the longitudinal axes of the needles.

The semiconductor member 4 according to FIG. 4 contains in its crystalline body 41 a matrix of needle-shaped inclusions 42 so oriented that their mutually parallel longitudinal axes extend substantially perpendicular to the longitudinal axis of the semiconductor body. The electric current axis, denoted by the arrow 43, and the direction of the external magnetic field B are perpendicular to each other and also perpendicular to the longitudinal direction of the needles.

According to FIG. 5, the semiconductor body 5 contains in its crystalline body 51 a matrix of needle-shaped inclusions 52 in such orientation that the axis 53 of the electric current is parallel to the longitudinal direction of the parallel needles and the external magnetic field B is perpendicular to their longitudinal direction.

The graph in FIG. 6*a* indicates the dependence of the resistance change $\rho_B/\rho_0$ upon the magnetic induction B for different semiconductor members according to the invention consisting of InSb with segregated inclusions as described above. The curves 61, 62, 63, 64 shown in the graph were determined at normal room temperature (20° C.). Indicated along the abscissa is the magnetic induction B in kilo Gauss (kG). The ordinate indicates the change in resistance by the numerical values of the ratio $\rho_B/\rho_0$, where $\rho_0$ denotes the specific resistance at zero magnetic field, and $\rho_B$ the specific resistance under the effect of the magnetic field. The semiconductor body in all cases represented in FIG. 6 consisted of InSb with inclusions of NiSb amounting to 1.8% by weight. Curve 61 relates to a semiconductor member according to the invention with spheroid inclusions irregularly distributed according to FIG. 2. The resistance change at 10,000 Gauss was about 300%. Curve 62 relates to a semiconductor member with parallel needle-shaped inclusions oriented as shown in FIG. 3. In this case the resistance change at 10,000 Gauss was about 200%. Curve 63 shows the resistance change for a semiconductor member with needle-shaped inclusions oriented in accordance with FIG. 5 and indicates a resistance change of about 100% with an external magnetic field of 10,000 Gauss. Curve 64 relates to a semiconductor member with needle-shaped inclusions oriented in accordance with FIG. 4 and indicates that the resistance change for such an orientation reaches a maximum. In this case the resistance change was about 1100% with a magnetic field of 10,000 Gauss. In contrast with the values apparent from the graph, intrinsically conducting InSb at normal room temperature exhibits at 10,000 Gauss a resistance change of about 55%.

The graph in FIG. 6*b* indicates the dependence of the resistance change $\rho_B/\rho_0$ upon the magnetic induction B for different semiconductor members according to the invention consisting of InSb with segregated inclusions of $CrSb_2$ amounting to 2.5% by weight. Curve 65 relates to a semiconductor member with parallel needle-shaped inclusions oriented as shown in FIG. 3. In this case, the resistance change at 10,000 Gauss was about 120%.

Curve 66 relates to a semiconductor member with needle-shaped inclusions oriented in accordance with FIG. 4. In this case, the resistance change was about 670% with a magnetic field of 10,000 Gauss.

The graph shown in FIG. 7 indicates the dependence of the Hall voltage measured with a semiconductor member according to the invention consisting of InSb with inclusions of NiSb amounting to 1.8% by weight. The specific electric conductance was 259 (ohm cm.)$^{-1}$, and the charge carrier mobility $\mu$ was 20,500 cm.$^2$/v. second. The abscissa of the graph indicates the magnetic induction in kG, and the ordinate the Hall voltage $U_H$ in mv. The curve 71 differs from the known course of the Hall voltage versus magnetic induction by exhibiting a behavior similar to saturation effect. This characteristic is particularly suitable for use in control and regulating applications.

EXAMPLE I

*Method for oriented distribution of the inclusions*

98.2 g. of InSb were melted together with 1.8 g. of zone-melted NiSb in a noncarburized quartz boat of semicylindrical inner shape and kept molten at 750 to 800° C. for about one hour. Thereafter the melt was subjected to normal freezing at an advancing rate of 2.7 mm./min. The resulting solid ingot was twice zone-melted at a zone travel rate of 1 mm./min. The semicylindrical body of material thus obtained was cut into rods of the desired size.

EXAMPLE II

*Method for unoriented distribution of the inclusions*

Indium antimonide was melted with 1.8% by weight of NiSb at a temperature of 750 to 800° C. for one hour in a noncarburized quartz boat. The homogeneous melt was then suddenly run out of the hot furnace zone so that no oriented solidification (normal freezing) of the melt could occur. Thereafter the resulting semicylindrical ingot was subdivided into rods of the desired size.

EXAMPLE III 326 g. of InSb were melted together with 15.8 g. of $Mn_2Sb$ and 8.3 g. Sb (corresponding to 6.9% by weight of MnSb) in a carburized quartz boat of semicylindrical inner shape and kept molten at 700° C. for about one hour in an atmosphere of Ar. Thereafter the homogeneous melt was then pulled out of the hot furnace at a rate of about 0.6 mm./min. so that the inclusions crystallize in an oriented manner.

EXAMPLE IV 195 g. InSb were melted with 5.0 g. $CrSb_2$ in an Ar atmosphere at 700° C. The homogeneous melt was subjected to normal freezing and afterwards zone-melted several times at a rate of about 1 mm./min.

The above-mentioned electrical or electromagnetical properties and operating characteristics of semiconductor members according to the invention are utilized to advantage and for the purpose of achieving novel improvements or novel effects in the electronic devices described presently with reference to FIGS. 8 to 21, each comprising such a semiconductor member as an operationally essential component.

FIGS. 8 to 11 relate to a continuously adjustable, stepless potentiometer. It comprises a magnet whose poles are denoted by N and S in FIG. 8. Disposed in the magnetic field between the poles is a semiconductor assembly which is rotatable about pivot pins P and comprises two semiconductor members S1 and S2 rigidly fastened together in mutually insulated relation. One end of member S1 is connected to a terminal A. The other end is connected to a terminal B to which the adjacent end of the second semiconductor member S2 is also electrically connected. The remaining end of semiconductor member S2 is connected to a terminal C. When the semiconductor assembly is rotationally adjusted to a different angular position, the voltage distribution between members S1 and S2 is changed in mutually inverse relation when a source of constant voltage is connected between terminals A and C as shown in FIG. 10. The effect is that of a potentiometer rheostat of a type shown in the substitute circuit diagram according to FIG. 11, except that the device according to the invention achieves the desired voltage division in a stepless manner and without the use of a mechanical slide contact. In conjunction therewith the device takes advantage of the greatly increased change in resistance as a result of changes in effective magnetic inductance achieved by the inclusions distributed in the semiconductor members, particularly if anisotropic inclusions are oriented as described above.

FIG. 12 shows a device of similar type in which two semiconductor members S3 and S4 according to the invention are attached to each other in mutually insulated relation and are shifted on a translatory path to a larger or smaller extent into the field between the poles N and S of a magnet 17. The performance is in accordance with the one described with reference to FIGS. 8 to 11.

A similar potentiometric operation is obtained with a device according to FIG. 13 in which only one semiconductor member 1 is used in series connection with an ordinary resistor 18 and in cooperation with a magnet 16. The resistor 18 may consist of a magnetically nonresponsive resistor or it may also consist of a semiconductor member which, however, is not subject to changes of a magnetic field. It will be understood that instead of making the member 1 displaceable relative to the magnet 16, it may also be fixedly mounted in the field gap and the magnet be excited electrically for the purpose of changing its effective field strength to thereby change the resistance of the semiconductor member.

FIG. 14 illustrates schematically the circuit of a modulator capable of modulating a direct voltage or an alternating voltage of much lower frequency than the modulation to be applied. A semiconductor field plate or disc 25 with dispersed and preferably oriented inclusions according to the invention is mounted in the field gap of a magnetizable core 26 provided with an energizing coil 27. The semiconductor member 25 is connected in series with a source 28 of direct voltage (or low-frequency A.C. voltage) to the primary winding of a transformer 29 whose secondary winding is connected through an amplifier with the output terminals OT of the device. The modulating frequency is impressed across the input terminals IT, and the modulated output voltage is taken from the output terminals OT of the amplifier.

The advantages of such a modulator according to the invention will be understood from the following. Aside from performing the desired modulation, a device of this type also produces in the semiconductor member an induced voltage at the input frequency. The induced voltage interferes with the desired modulation. The size of the magneto-responsive field plate 25 must therefore be made very small in order to keep the induced voltage small, but the feasible reduction in size is limited. For example, when a semiconductor device according to FIG. 6 of the above-mentioned Patent 2,894,234 is used for such purposes, the spacing of the interposed metal layers 14 must be small relative to the width of the semiconducting resistor body. The feasible minimum width is approximately 50 microns. This corresponds to a width of 0.3 mm. for the metal layers. In contrast thereto, conductive anisotropic inclusions, such as the above-mentioned needle-shaped segregations of NiSb in InSb have a mutual spacing of only 2 to 3 microns. The semiconductor body can readily be given a width of 30 microns, for example. This reduces the semiconductor surface by the factor of $10^2$. The disturbing induced voltages are reduced in the same ratio. For example, with the known device having a semiconductor surface of 20 mm.$^2$, a signal at 5000 c.p.s. carrier frequency is transmitted together with a disturbing induced voltage of about 60 millivolts at 3000 Gauss, and an induced voltage of 30 microvolts at the second harmonic frequency of 10,000 c.p.s. For a signal voltage of 5 microvolts D.C., the measurable output voltage was approximately 1 microvolt. It will be apparent that if 1 microvolt is to be measured while simultaneously dealing with 30 microvolts second harmonic, the measurement is difficult and not of the desired reliability.

In contrast thereto, when a device according to the invention was used, employing a semiconductor member of InSb with oriented needle-shaped inclusions of NiSb as described above, the induced second harmonic voltage was about one-hundredth of the previously measured value, namely about 0.3 microvolt (10,000 c.p.s.) under otherwise comparable conditions. Consequently the measuring accuracy is greatly increased, aside from the fact that it is much easier to filter the 0.6 millivolt of 5000 c.p.s. fundamental frequency than to filter the 60 millivolts. The invention therefore has virtually afforded a successful use of a modulating device of this type which, although known in principle, was not suitable in practice on the basis of the prior art.

The reduction in size of the resistor for a given performance is also of advantage for the above-described potentiometer devices. For a given ohmic resistance, the device is smaller than it can be made with semiconductor members of the known type mentioned above. Consequently, the magnets are also smaller and the air gaps are likewise smaller. On the other hand, for a given size of instrumentality, the current-carrying capacity of the semiconductor rheostat or potentiometer is considerably greater.

FIG. 15 illustrates the example of a fundamental circuit diagram for a Hall-plate device according to the invention as a component of a control or regulating system serving to effect current or voltage limitation. The current $i$ passes through input terminals IT and through a semiconductor Hall plate S with dispersed and preferably oriented anisotropic inclusions as described in the foregoing. It will be understood that the Hall plate S is exposed to a magnetic field. The current $i$ may be kept constant, in which case the desired control or regulation is effected in dependence upon the varying intensity of the magnetic field. The Hall voltage taken from probe-type Hall electrodes is applied to an amplifier AM whose output terminals OT are to be connected to the load circuit to be controlled or regulated. The Hall voltage impressed upon the amplifier and effecting the desired control or regulation depends upon the magnitude of the input current. However, due to the saturation-type characteristic of the semiconductor member, typified by curve 71 in FIG. 7, the Hall voltage reaches a maximum value at a given current magnitude thus preventing over-control in the event the Hall plate S is subjected to excessively high magnetic fields.

FIG. 16 shows a semiconductor device according to the invention employed as a component of a regulating system. The device comprises a semiconductor member 35 with dispersed inclusions as described above. The member is disposed in the field gap of a magnetizable core 36 equipped with an energizing winding 37. The semiconductor member 35 forms one branch of a bridge network. The other branches comprise ohmic resistors 38, 39 and 40 respectively. The network is energized from a current source 41 and has a reversible control motor 42 connected with its output diagonal. While a direct connection of the motor is shown schematically, it will be understood that amplifying or relay means may be interposed. The shaft of motor 42 is connected with the movable slide contact 43 of a potentiometer 44 which is energized from a current source 45. The equipment to be regulated is schematically shown at 46 and assumed to consist of voltage generating means whose output voltage across buses 47 is to be kept constant. For regulation, the tapped-off portion of the rheostat 44 is connected to the voltage control means (not shown) of the equipment 46. The energizing coil 37 receives voltage from a potentiometer 48 whose selected adjustment determines the datum value of bus voltage to be kept constant.

When the bus voltage is in accordance with the datum value, the bridge, calibrated by means of the adjustable resistor 38, is balanced and the motor 42 is at rest. When the voltage of buses 47 departs from the datum value, the coil 37 receives more or less energizing current than required for maintaining the semiconductor member 35 at the resistance that just balances the bridge network. Consequently, the network becomes unbalanced and the motor 42 runs in one or the other direction, thus changing the adjustment of the rheostat 44 in the sense and by the amount required to reestablish by means of coil 37 the proper resistance of member 35 at which the bridge network is balanced.

FIG. 17 illustrates an embodiment of the invention for the purpose of measuring the strength and direction of a magnetic field. A Hall plate 51 made according to the invention is subjected to the magnetic field being investigated and changes its ohmic resistance accordingly. This varies the voltage drop originating from the current supplied by a source 52 through a resistor 53. The voltage drop is indicated by a measuring instrument 54 and may also be amplified in order to be available at terminals 55 for any desired purposes. Another measuring instrument 56 is connected across the Hall electrodes of the Hall plate 51 to indicate by the polarity of the measured voltage the direction of the magnetic field.

FIGS. 18 and 19 relate to the use of the invention for transmitting a signal in response to a positional change. A semiconductor member 61 according to the invention is mounted along the travel path of a permanent magnet 62 whose travel direction, indicated by an arrow X, is across the semiconductor member. The semiconductor member 61 forms a bridge network together with resistors 63, 64 and 65. The input diagonal is energized by constant direct or alternating voltage. A measuring instrument 66 or any other desired electric device is connected in the output diagonal. As the magnet 62 approaches the vicinity of the semiconductor member 61, the output voltage of the bridge network reaches a maximum when the position of the magnet is closest to the semiconductor member. This position is denoted by O in the graph of FIG. 19 where the resulting voltage signal is typified by the curve $V_s$.

FIGS. 20 and 21 relate to a similar position-responsive device, the same components being denoted by the same respective reference numerals as in FIG. 18. According to FIG. 20 the semiconductor members 61 is premagnetized in a field gap between pole shoes 67 and 68 joined with a permanent magnet 69. This affords producing a signal output voltage $V_s$ of the type shown in FIG. 21. The signal voltage reverses its polarity as the relative position between the travelling magnet and the semiconductor member reaches closest proximity. As a result, the direction of approach can be determined from the signal voltage. It will be understood that in devices of the type according to FIGS. 18 and 20, the semiconductor member may be mounted on travelling structure, whereas the cooperating magnet may be given a fixed position. Proximity-responsive sensing devices of this type also take advantage of the increase in magnetic response or the reduction in dimensions afforded by virtue of the invention.

Relative to the foregoing references to inclusions consisting of compounds, it should be noted that these compounds need not, and often do not, have a strictly stoichiometric composition. For example, NiSb may have a homogeneity range of 46.3 to 53.3 atom percent Sb at room temperature (M. Tansen and K. Anderko, Constitution of Binary Alloys, McGraw-Hill Book Company, New York, 1958, page 1037). However, for obtaining suitable anisotropic segregations, particularly in the shape of needles, the semiconductor member should be produced from a homogeneous melt of substantially eutectic composition. Only then is a most desirable two-phase ingot with oriented anisotropic inclusions obtainable. Thus, when applying normal freezing or zone melting to InSb with 1.5 to 2% by weight of NiSb (within the above-mentioned range of homogeneity) the resulting NiSb inclusions have the shape of needles 10 to 60 microns long and about 1 to 2 microns in diameter, the spacing between the needles being about 2 to 3 microns, and the longitudinal axes being well aligned in parallel relation to the direction of progressing solidification. With semiconductor members made from an eutectic melt of InSb with an addition of 1.8% NiSb by weight of the the InSb increases in magnetoresistance above 1700% at 10 kG. (room temperature) have been observed. The NiSb-phase segregated within the percentage range stated, does not effect doping of the InSb.

Other eutectic compositions particularly well suitable for the purposes of the invention are InSb with an addition of 2.9% $FeSb_2$. InSb with an addition of about 6.9% MnSb, InSb with 2.5% $CrSb_2$, GaSb with 80.1% Sb, for example.

It has been found that for obtaining highest resistance changes the inclusions should be uniformly distributed over the entire volume of the embedding substance, particularly in the case of $A^{III}B^{V}$ compounds. For the same reason, the inclusions should have preferably in one direction a dimension about one order of magnitude larger than in other directions, and a defined boundary surrounded on all sides by pure semiconductor substance.

Aside from the objects stated above, the invention also aims generally at providing a potentiometer which is entirely free of mechanical contacts and affords a fully continuous adjustment of the output voltage. It will be recognized that this object is achieved by semiconductor devices as described above with reference to FIGS. 8 to 11 regardless of whether or not the semiconductor material contains embedded inclusions.

Another object of the invention is to devise a galvanomagnetic resistance probe of smaller size than heretofore available for a given efficacy, or to increase the efficacy of such a probe for a given size.

Another object of the invention is to provide an extremely flat magnetogalvanic probe for use in narrow field gaps.

A further object of the invention is to devise a galvanomagnetic probe that always responds to the amount of magnetic induction regardless of the position occupied by the probe relative to the direction of the magnetic field.

Still another object of the invention is to produce a planar probe suitable for sensing or measuring a spacial, i.e. three-dimensional, magnetic field.

To achieve these objects and in accordance with a feature of our invention, the galvanomagnetic semiconductor device consists essentially of a flat surface member which has mutually spaced terminals for connection of the member into an electric measuring circuit; and this member consists of semiconductor substance which contains the above-mentioned anisotropic inclusions oriented in a direction substantially perpendicular to the surface of the member.

According to another feature of our invention, we form the semiconductor device of a carrier member which has an insulating planar surface and we coat the surface with a layer of semiconductor substance containing a multitude of insoluble inclusions dispersed and integrally embedded in the substance as mentioned in the foregoing, the anisotropic inclusions being substantially all oriented in a given direction.

According to another feature of the invention, a planar semiconductor strip is provided with lateral recesses so as to have meander or zigzag shape, the main axes of the anisotropic inclusions extending perpendicularly to the plane of the strip. This results in an extremely small magnetic probe particularly suitable for response to a magnetic field in extremely narrow spaces, such as the longitudinal field in bores.

According to a further feature of our invention we provide an insulating carrier surface with two planar semiconductor members, each containing anisotropic inclusions embedded in the semiconductor substance, the inclusions in one member being oriented perpendicularly to the surface plane of the carrier, whereas the inclusions in the other member are oriented in a direction parallel to that surface. Such a device is suitable for simultaneous response to magnetic-field components in two or three coordinate directions.

The known magnetically responsive resistance probe shown in FIG. 22 consists essentially of a flat strip 101 formed of homogeneous semiconductor substance and carrying on its surface a multiplicity of transverse lines 111 of good conducting material, for example silver. Such a device responds only to the one component of a magnetic field B that is directed perpendicularly to the plane of the silver lines. For that reason a device of this type is not well suitable for sensing magnetic fields in very narrow spaces. For example, the device can be used for measuring longitudinal magnetic fields in bores and narrow gaps of electrical machines only if the spacing transverse to the direction of the field strength suffices for introducing the probe. Particularly unfavorable in this respect is the space required for the solder joints 114 and 115 on the semiconductor strip 101 because during measuring operation the semiconductor strip extends transverse to the flux direction so that the current supply leads 112 and 113 must also extend transversely of the bore or gap and hence just in the one direction in which only little space is available.

FIGS. 23 and 24 show respective semiconductor members 102, 103 with meander- and zigzag-shaped legs 121, 131. Each member forms a thin layer on the planar surface of an insulating carrier strip such as the one shown at 120 in FIGS. 23 and 25. An arrow B indicates the direction of the magnetic-field component to which the device is responsive. This component coincides with the longitudinal axis of the semiconductor strip. In the device of FIGS. 23 and 25, the magnetic-field responsive elements are constituted by the legs 121 extending transverse to the flux direction as well as to the longitudinal direction of the semiconductor strip. In the device shown in FIG. 24, the legs 131, or rather their orthographic projection onto a plane transverse to the flux direction B, may be looked upon as constituting the galvanomagnetically active elements.

In both devices, the semiconductor substance is heterogeneous, consisting of semiconductor substance, such as indium antimonide, and anisotropic, preferably needle-shaped inclusions 122, 132 which are oriented in a direction perpendicular to the plane of the semiconductor strips, this being best apparent from FIG. 25 in which the thickness of the carrier 120 and of the strip is shown disproportionately exaggerated.

Compared with a device of the known type represented in FIG. 22, those according to the invention as exemplified by FIGS. 23 to 25 can be given considerably smaller dimensions for a given sensitivity, or exhibit increased efficacy for given dimensions, and they also are more easily applicable for field measurements in extremely narrow spaces. This will be explained presently.

The reduction in size obtainable by virtue of the invention will be understood if one considers that the available methods for providing a semiconductor body according to FIG. 22 with parallel silver lines of minimal spacing are readily applicable for producing meander- or zigzag-shaped strips of the same size as that of the silver lines heretofore employed. The known microprobes with silver lines on the surface of a semiconductor strip can be reduced in size only to such an extent that a satisfactory application of the silver lines still remains feasible. Since for maximal dependence of the ohmic resistance upon the magnetic field a largest possible number of silver lines must be applied, the smallest dimensions of the semiconductor strip have been always many times as large as the silver lines.

In a semiconductor device according to the invention, the silver lines on the surface are substituted by microscopically small inclusions dispersed throughout the semiconductor body and oriented in a given direction. These inclusions have an electric conductance higher by more than one order of magnitude than the conductance of the embedding semiconductor substance, and thus virtually constitute short-circuiting elements within the semiconductor.

The inclusions, such as nickel antimonide (NiSb) needles in indium antimonide (InSb) do not require production by any machining or etching method because they result by segregation from a eutectic melt, and their orientation is effected by normal freezing or zone melting as is more fully set forth in the copending application mentioned above. Consequently, the production of the semiconductor device for sensing or measuring magnetic fields is essentially limited to converting the semiconductor strip to the meandor or zigzag shape with the aid of conventional methods. One way of doing this is to correspondingly etch the thin semiconductor strip.

A particular difficulty encountered with the known galvanomagnetic probes with silver lines according to FIG. 22 is due to the necessity of soldering current supply leads to the strip. The mechanical strength required of the solder joint and the necessity for sufficient reliability of the contact, do not permit reducing the volume of the joints below a given amount. This contributes to the above-mentioned difficulty of using such probes in extremely narrow bores or gaps.

Since in the semiconductor devices according to the invention as shown in FIGS. 23 and 24 the direction of the magnetic field B is identical with the longitudinal direction of the semiconductor strip, the space occupied by the soldered joints 125, 126 or 135, 136 and by the current supply leads 123, 124 or 133, 134 is no longer troublesome. In these devices, the current supply leads extend in the longitudinal direction of the magnetic field and consequently in the longitudinal direction of the bores. In this direction, as a rule, sufficient space is available for amply accommodating the leads. Thus, the trouble encountered with the known probe according to FIG. 22 by the disadvantageous position of the supply leads is prevented.

Semiconductor devices have been made in accordance with FIGS. 23 and 24. In these, the semiconductor strip had a width $b$=50 micron, a thickness of 30 micron. The length of the straight leg portion was 300 micron=0.3 mm. An ohmic resistance of approximately 20 ohms was measured along the entire meander or zigzag shape without application of a magnetic field. However, any desired number of the individual leg portions (FIGS. 23 and 24) can be provided. The series connection of such legs readily permits obtaining a resistance of 2000 to 3000 ohms at zero magnetic field. In a magnetic field of 10,000 Gauss, the probe then exhibits an ohmic resistance of approximately 20,000 to 30,000 ohms or more.

The increase in ohmic resistance per unit area or volume of the semiconductor member, achieved by the reduction in geometric dimensions, is particularly significant when employing the devices in transistor circuits or Wheatstone bridge networks.

For example, FIG. 24 shows such a galvanomagnetic probe directly connected between the emitter of a p-n-p transistor TR and the negative pole of a voltage source 137 in a conventional transistor circuit in emitter-base connection operating with a voltage in the preferred operating range, for example 24 volts. Under such and similar operating conditions, the probe can be rated to constitute substantially all of the series resistance in the base-emitter circuit thus avoiding the necessity of providing the sensing circuit proper with additional series resistors as may affect the accuracy of the measuring result. Accordingly, only the probe 103 and the 24-volt source 137 are connected in the emitter-base circuit of the illustrated example, a measuring device 139, preferably an oscillograph, and a source 138 of voltage for the instrument being connected between the emitter and collector of the transistor.

As mentioned, the heterogeneous semiconductor member is disposed on the flat surface of an insulating carrier body which may also carry the current supply terminals as is apparent from FIG. 25. The insulating carrier 120 may consist of a thin strip of synthetic plastic, glass, sintered ceramics such as sintered alumina or sintered ferrite of the ferrox-cube type. Also applicable are carrier strips or sheets or conducting but surface-insulated materials such as oxidized aluminum. A similar variety of carrier materials is also applicable in conjunction with the other embodiments described hereinafter. In lieu of an insulating carrier member or in addition thereto, the device may be enclosed in an envelope of non-magnetic material or of magnetically highly permeable material for guiding the magnetic flux. The external shape of the probe is preferably given the configuration adapted to the particular purpose intended. For example, if magnetic fields in bore holes of machine parts are to be measured, the external shape of the enclosed probe is preferably that of an elongated cylinder or rod.

For other purposes, such as field measurements between flat pole shoes, the semiconductor member with the above-mentioned anisotropic inclusions is preferably formed by a flat loop extending substantially in a plane relative to which the anisotropic, preferably needle-shaped inclusions are perpendicularly oriented. Such a device always responds to the projection of the magnetic field onto the plane of the loop regardless of the position which the device may occupy with respect to the direction of the electric field.

Figure 26:
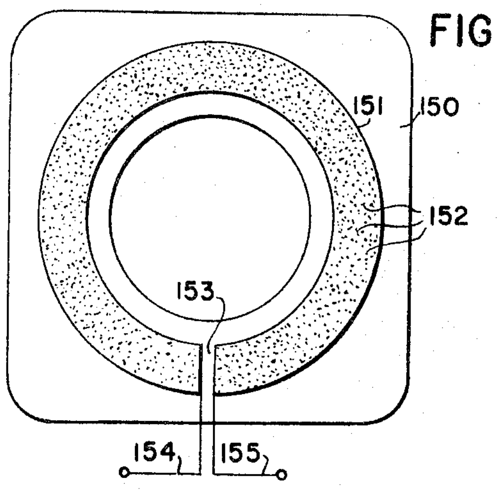

FIG. 26 shows a ring-shaped strip 151 of insulating material on the insulating surface of a carrier sheet 150. The anisotropic inclusions 152 dispersed throughout the strip material 151 are oriented perpendicularly to the plane of the surface. The circular ring 151 is interrupted at 153 and has its ends connected with current supply leads 154 and 155.

Figure 27:
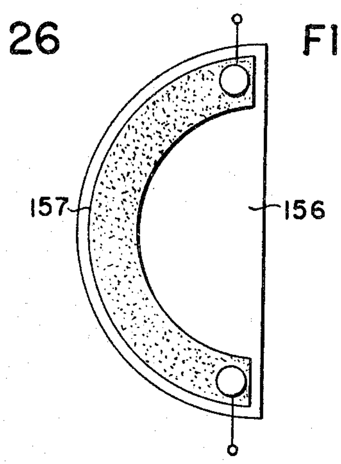

A device of functionally similar performance is obtained by dividing the semiconductor ring in the diametrical direction perpendicularly to the ring plane and attaching the current supply leads to the ends of the semicircular member. Such an embodiment is shown in FIG. 27 where a semicircular carrier 156 is provided with a likewise semicircular semiconductor member 157 whose anisotropic inclusions extend perpendicularly to the plane of the carrier surface.

Figure 28:
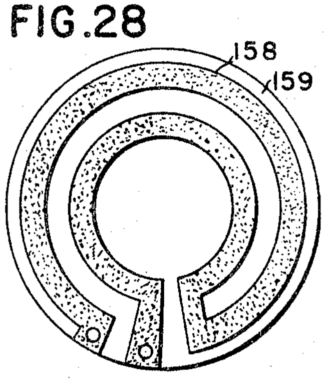
Figure 29:
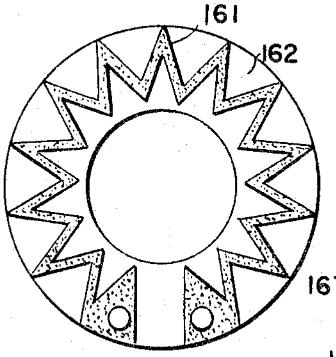

For purposes requiring a particularly high ohmic resistance, the semiconductor member is preferably designed as a planar spiral, ring-shaped meander or ring-shaped zigzag. Thus FIG. 28 shows a ring-shaped meander 158 of heterogeneous semiconductor substance on a circular carrier 159; and FIG. 29 shows a ring-shaped meander strip 161 of such semiconductor material on a ring-shaped carrier 162 of insulating material. When using a spiral shape, similar to the ring-shaped meander of FIG. 28, a substantially ohmic resistance in each turn of the spiral can be obtained by giving each turn a width proportional to the distance from the center.

For reasons of symmetry, the described semiconductor shapes based upon a circle or upon a configuration approximating a circle, always respond to the maximal magnetic induction in the plane of the semiconductor member, independently of the particular relation between the resistance of the semiconductor material and the induction of the magnetic field.

Figure 30:
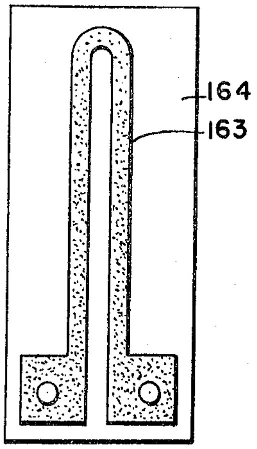

Another loop-shaped semiconductor member 163 is shown in FIG. 30. This member has elongated hair-pin shape. It is disposed on the planar top surface of a carrier plate 164 consisting of sintered ferroxcube-type ferrite of high magnetic permeability. In a device made according to FIG. 30, the semiconductor material employed consisted of indium antimonide (InSb) with needle-shaped inclusions of nickel antimonide (NiSb) oriented perpendicularly to the plane of the carrier 164. The material was prepared from a eutectic melt of InSb and NiSb (containing 1.8% by weight of NiSb). The over-all dimensions of the semiconductor loop 163 were 0.25 x 2 mm.$^2$. The ferrite carrier 164 had a surface area of 1 x 3 mm.$^2$. The thickness of the semiconductor layer was 20 microns. The resistance measured without magnetic field was 125 ohms. The device was found particularly well suitable for operation as a contactless chopper for converting direct current into periodic current. For this purpose it was subjected to the field in a narrow pole gap of an electromagnet energized at a frequency of 5 kilocycles per second, resulting in a chopper frequency of 10 kilocycles.

FIG. 31 shows a rectangular semiconductor member 165 with mutually perpendicular legs 167 and 168. The electrically good conducting inclusions 166 are oriented perpendicular to the plane of the semiconductor member. The member forms a strip coating on an insulating carrier 169. Attached to the ends of the two legs are respective current leads 170 and 171 for connecting the semiconductor member to a measuring circuit. It will be understood that the two legs 167 and 168 can be supplemented by two parallel legs to form a square-shaped loop which is interrupted at only one location between the terminal points where the current leads are attached.

In contrast to the loop-shaped semiconductor devices shown in FIGS. 26 to 29, an angular device according to FIG. 31 furnishes directly an accurate response to the projection of the magnetic induction or to its plane only under the condition that the resistance of the semiconductor varies with the square of the induction. This is due to the fact that the legs 167 and 168 of the semiconductor member 165 respond only to the induction components directed at a right angle to the respective legs. For determining the maximum value of induction in the plane of the semiconductor member 105, i.e. for determining the projection of the magnetic field to be measured with respect to that plane, it is therefore necessary to geometrically (vectorially) add the induction components and hence the resistance changes caused thereby in the respective legs 167 and 168. For this reason the projection of the magnetic field upon the plane of the semiconductor member 105 can be directly determined by means of this embodiment only if the resistance in the legs 167 and 168 changes with the square of the induction components perpendicular to the respective legs. That is, the semiconductor legs must exhibit a square resistance characteristic, or it is at least necessary, for accurate measuring, to operate in a square portion of the characteristic and hence at low values of magnetic induction. The ohmic resistance of this device can be further increased by giving the legs a meander-shaped design as exemplified by FIG. 24. A further increase in ohmic resistance, or any desired dependence of the resistance change upon the magnetic field, can also be attained by a combination of the various loop shapes described.

Devices of the type described can be provided with a second semiconductor member of the same heterogeneous constitution which is likewise located in the plane of the carrier or loop but has its inclusions oriented in parallel relation to the plane. Such an additional member permits also sensing or measuring the magnetic-field component that extends perpendicularly to the plane of the above-mentioned loop.

The device shown in FIG. 32 embodies the just-mentioned features in a planar probe that affords sensing or measuring a spacial, i.e. three-dimensional, magnetic field. The device comprises a ring-shaped semiconductor member 181 on an insulated planar surface of a carrier sheet 180. The member 181 corresponds to the member 151 in FIG. 26. Its anisotropic, preferably needle-shaped, inclusions 182 are oriented perpendicularly to the plane of the carrier surface. Located in the same plane and also attached to the carrier surface is a flat and elongated strip-shaped semiconductor member 191 whose anisotropic inclusions 192 are oriented parallel to the plane of the loop and substantially at a right angle to the longitudinal direction of the strip member 191. The ring-shaped member 181 and the strip member 191 may consist of the above-mentioned InSb with inclusions of NiSb produced by freezing a eutectic melt. The thickness of the semiconductor members may amount to 20 microns or less. The median diameter of the ring-shaped member 181 may be given any desired size, for example a diameter of only 1 to 2 mm., although larger sizes are likewise applicable, for example a diameter of 2 cm.

The loop 181 with its current supply leads 183 and 184, and the strip 191 with its leads 194 and 195, are connected with respective voltage sources 195' and 196 in the emitter circuits of respective p-n-p transistors 197 and 198. Connected between the collector and emitter of each transistor is a measuring circuit which comprises a voltage source 199 or 200 and a measuring instrument 201 common to both circuits.

By virtue of the symmetrical, circular shape of the loop member 181, it responds to the magnetic field in its plane or to the projection of this field onto the plane, irrespective of the relation between the increase in semi-conductor resistance and the magnitude of the magnetic field. The strip-shaped member 191, on account of the different orientation of its inclusions 192, furnishes a response to the magnetic-induction component perpendicular to the plane of the two members.

In lieu of the resistance strip 191, a corresponding Hall plate may be provided whose Hall electrodes furnish an output voltage varying in response to the magnetic field so that the Hall voltage is a measure of the induction component perpendicular to the plane of the loop. The ring-shaped semiconductor member 181 may be substituted by any of the other loop shapes mentioned above.

As explained above with reference to FIG. 31, the measuring magnitudes furnished by the loop member 181 and the strip member 192 respectively require geometric (vectorial) addition. For that reason, the device shown in FIG. 32 furnishes a directly accurate measuring result only if the resistance changes are a square function of the magnetic induction acting upon the semiconductor. This condition is satisfied at low values of induction. In cases where the square-law dependence is now no longer met, for example at high values of induction, the measuring values furnished from the respective member 181 and 191 must be separately passed through two amplifiers to a squaring circuit or computing device for obtaining the correct result.

A semiconductor device embodying the just-mentioned loop and strip features constitutes an extremely flat magnetically responsive probe which always responds to the amount of magnetic induction irrespective of its position relative to the magnetic-field direction. The semiconductor bodies that form part of such a device consist of very thin semiconductor films or foils all located in the same plane or parallel thereto.

In contrast thereto, the above-mentioned known devices (FIG. 22) containing a rod- or strip-shaped semiconductor of homogeneous material with silver lines on its surface, can respond to the magnitude of a magnetic field in the surface plane only under the condition that the projection of the field onto the plane is coincident with the sensing direction of the semiconductor. That is, a probe of this type must be turned until the necessary coincidence between its direction of sensitivity with the direction of the magnetic field is established. For obtaining an automatic response to the maximum induction in a given plane, it is necessary to employ two probes of this type that extend perpendicularly to each other and that separately respond to the two components of field strength in the respective planes defined by the probes. Amplifiers and measuring devices connected to the respective probes are needed for determining the projection of the magnetic induction upon the give plane.

It will be realized, therefore, that by virtue of the above-mentioned features of the invention the design and use of the probes as well as the necessary circuitry are considerably improved and simplified.

As mentioned above, the semiconductor material in the described embodiments of the invention consists preferably of indium antimonide with needle-shaped inclusions of nickel antimonide produced by freezing a eutectic melt (containing 1.8% by weight of NiSb). The desired orientation is obtained by subjecting the melt to normal freezing or zone melting. The inclusions then become oriented in the freezing direction. Another way is to subject the melt during solidification to an electric or magnetic field. The NiSb needles segregating from the melt have an average length of 50 microns and an average thickness of 1 micron. The specific electric conductance of intrinsically conducting InSb at room temperature is 220 ohm cm. The corresponding conductivity of NiSb is approximately $7 \cdot 10^4$ ohm cm. Consequently the NiSb inclusions segregated and dispersed in the InSb substance have a much higher electric conductivity. When the current flow in such a heterogeneous semiconductor is in a direction perpendicular to the orientation of the inclusions and also perpendicular to the direction of the magnetic field so that the three directions correspond essentially to those of a spacial system of rectangular coordinates, a resistance change of 18 to 20 times the zero-field resistance is readily obtainable when applying a magnetic field of 10,000 Gauss.

We claim:

1. An electronic semiconductor device comprising a crystalline member of homogeneous semiconductor substance and a special matrix of discrete inclusions integrally embedded in said substance, said individual inclusions having fractionally small dimensions compared with the smallest dimension of said member and having a preferred direction of general alignment substantially parallel to one of the surface dimensions of said member; terminal means on said member and defining a current flow axis in said member; magnetic field means having a field in which said member is located with said current flow axis substantially perpendicular to the field axis, said direction of said inclusions being substantially perpendicular to both said current-flow and field axes.

2. A semiconductor device of the Hall generator type comprising a crystalline member of semiconductor substance and a multitude of insoluble inclusions dispersed and integrally embedded in said substance, said inclusions having anisotropic shapes and being substantially oriented in parallel relation to one another, two terminal means spaced from each other on said member and defining a current flow axis in said member, Hall electrodes spaced transversely of said flow axis between said respective terminals for providing an output voltage, magnetic field means having a field in which said member is located, said current flow axis being substantially perpendicular to the axis of said field, and said oriented inclusions of said member extending in directions substantially perpendicular to both said current-flow and field axes.

3. A semiconductor device comprising a crystalline member of semiconductor substance and a multitude of insoluble inclusions dispersed and integrally embedded in said substance, said inclusions having anisotropic shapes and being substantially oriented in parallel relation to one another, terminal means mutually spaced on said member and defining a resistance path therethrough, magnetic field means having a field area relative to which said member is displaceable for varying the resistance of said path between said terminals, said inclusions extending in directions susbtantially perpendicular to said path and to the direction of said field.

4. In a semiconductor device according to claim 3, said field means comprising a permanent magnet, and said member forming a potentiometer component.

5. In a semiconductor device according to claim 2, said field means comprising a magnetizable core and a magnetizing coil on said core, said coil and said terminal means forming part of respective two modulator input circuits, and modulator output leads attached to said respective electrodes.

6. A galvanomagnetic semiconductor device, comprising a flat surface member having mutually spaced terminals and consisting of semiconductor substance, said member having a multitude of insoluble inclusions dispersed and integrally embedded in said susbtance, said inclusions having anisotropic geometric shapes and being oriented in directions substantially perpendicular to the surface of said member.

7. A semiconductor device, comprising a carrier member having an insulating surface, a layer of semiconductor substance on said surface, said layer having a multitude of insoluble inclusions dispersed and integrally embedded in said substance, said inclusions having anisotropic geometric shapes and being oriented in directions substantially perpendicular to said carrier surface.

8. A galvanomagnetic resistance device, comprising a carrier member having an insulating planar surface, a resistance member forming a flat layer on said planar surface and having current supply leads attached to both ends respectively, said resistance member consisting of indium antimonide and a multitude of needle-shaped inclusions of nickel antimonide amounting to about 1.8% by weight of the member, said inclusions being oriented in directions substantially perpendicular to said carrier surface.

9. A galvanomagnetic resistance device, comprising a carrier member having an insulating planar surface, a generally strip-shaped resistance member forming a flat layer on said planar surface and having current supply leads attached to both ends respectively, said resistance member consisting of semiconductor substance and a multitude of insoluble inclusions dispersed and integrally embedded in said substance, said inclusions having anisotropic geometric shapes and being parallel to one of the coordinate directions determined by the plane of said surface and the direction perpendicular to said surface.

10. A galvanomagnetic resistance device, comprising a flat and substantially planar strip member of zigzag-type shape having current supply terminals at both ends respectively and consisting of semiconductor substance having a multitude of insoluble inclusions dispersed and integrally embedded in said substance, said inclusions having anisotropic geometric shapes and being oriented in directions substantially perpendicular to the plane of the strip.

11. A galvanomagnetic resistance device, comprising a flat and substantially planar loop member which is open to form two ends and has current supply means at said respective ends, said loop member consisting of semiconductor substance having a multitude of anisotropic inclusions of higher conductivity than said substance, said inclusions being dispersed and embedded in said substance and oriented in a given direction relative to the plane of said loop.

12. A semiconductor device, comprising a carrier member having an insulating surface, a layer of semiconductor substance on said surface, said layer forming a loop which is open to form two ends and has current supply means at said respective ends, said loop-shaped layer having a multitude of insoluble inclusions dispersed and integrally embedded in said substance, said inclusions having anisotropic geometric shapes and being oriented in directions substantially perpendicular to said carrier surface.

13. In a galvanomagnetic resistance member according to claim 11, said loop forming a substantially circular arc.

14. In a galvanomagnetic resistance member according to claim 11, said loop forming a substantially semicircular arc.

15. In a galvanomagnetic resistance member according to claim 11, said loop having generally zigzag shape along its perimeter.

16. In a galvanomagnetic resistance device according to claim 6, said semiconductor member having the shape of an angle, and said terminals being located at the leg ends of said angle shape.

17. A galvanomagnetic resistance device, comprising a carrier having an insulating planar surface, two resistance members forming respective flat layers on said surface and having each two ends provided with respective current supply means, said two members consisting of semiconductor substance and a multitude of anisotropic inclusions of higher conductance than said substance, said inclusions in one of said members being oriented in a direction perpendicular to the carrier surface, and said inclusions in said other member being oriented in parallel relation to said surface.

18. A galvanomagnetic resistance device, comprising a carrier having an insulating planar surface, two resistance members forming respective flat layers on said surface, one of said members having the shape of a loop which is open to form two ends and has current supply means at said respective ends, said other member having the shape of a strip and having respective current supply means at its two ends, each of said two members consisting of semiconductor substance and a multitude of anisotropic inclusions of higher conductance than said substance, said inclusions in said loop-shaped member being oriented in a direction perpendicular to the carrier surface, and said inclusions in said other member being oriented in parallel relation to said surface.

References Cited by the Examiner

UNITED STATES PATENTS

| | | | |
|---|---|---|---|
| 2,691,577 | 10/1954 | Lark-Horovitz et al. | 75—134.7 |
| 2,778,802 | 1/1957 | Willardson et al. | 148—1.5 X |
| 2,858,275 | 10/1958 | Folberth | 75—134.7 X |
| 2,894,234 | 7/1959 | Weiss et al. | 317—234 X |
| 3,082,507 | 3/1963 | Kuhrt et al. | 338—32 X |
| 3,134,083 | 5/1964 | Freytag et al. | 338—32 |

ANTHONY BARTIS, *Acting Primary Examiner.*

RICHARD M. WOOD, *Examiner.*

W. D. BROOKS, *Assistant Examiner.*